(12) United States Patent
Hamilton, II et al.

(10) Patent No.: US 11,038,603 B2
(45) Date of Patent: Jun. 15, 2021

(54) ANTENNA DETECTION THROUGH NOISE MEASUREMENT

(71) Applicant: Neptune Technology Group Inc., Tallassee, AL (US)

(72) Inventors: Gary Wayne Hamilton, II, Auburn, AL (US); Steven Donald Bragg, Tallassee, AL (US)

(73) Assignee: Neptune Technology Group Inc., Tallassee, AL (US)

( * ) Notice: Subject to any disclaimer, the term of this patent is extended or adjusted under 35 U.S.C. 154(b) by 0 days.

(21) Appl. No.: 16/832,539

(22) Filed: Mar. 27, 2020

(65) Prior Publication Data

US 2020/0313778 A1  Oct. 1, 2020

Related U.S. Application Data

(60) Provisional application No. 62/825,885, filed on Mar. 29, 2019, provisional application No. 62/828,105, (Continued)

(51) Int. Cl.
*H04B 17/20* (2015.01)
*H01Q 1/50* (2006.01)
(Continued)

(52) U.S. Cl.
CPC ............... *H04B 17/20* (2015.01); *H01Q 1/50* (2013.01); *H03F 3/20* (2013.01); *H04B 1/0458* (2013.01);
(Continued)

(58) Field of Classification Search
CPC ........ H04B 17/20; H04B 1/0458; H04B 1/18; H04B 7/0608; H04B 17/00;
(Continued)

(56) References Cited

U.S. PATENT DOCUMENTS 5,471,146 A  11/1995 Krayeski et al.
5,493,650 A  2/1996 Reinke et al.
(Continued)

FOREIGN PATENT DOCUMENTS

CN  101217303 A  7/2008
CN  101299644 B  11/2008
(Continued)

*Primary Examiner* — Nguyen T Vo
(74) *Attorney, Agent, or Firm* — Snyder, Clark, Lesch & Chung, LLP (57) ABSTRACT

A system includes a radio frequency (RF) receiver having an input, and an antenna terminal configured to connect to an antenna. The system further includes one or more switches that switch the receiver input of the RF receiver to connect to a terminating load that is not an antenna or to an internal antenna, and noise level measurement circuitry that measures a first RF noise level across the terminating load or the internal antenna. The one or more switches further switch the receiver input of the RF receiver to connect to the antenna terminal, and the noise level measurement circuitry further measures a second RF noise level received at the antenna terminal. The system also includes a controller that determines whether an external antenna is connected to the antenna terminal based on the first RF noise level and the second RF noise level.

20 Claims, 9 Drawing Sheets

Related U.S. Application Data filed on Apr. 2, 2019, provisional application No. 62/835,669, filed on Apr. 18, 2019.

(51) Int. Cl.
*H04B 17/00* (2015.01)
*H03F 3/20* (2006.01)
*H04B 1/04* (2006.01)
*H04B 1/18* (2006.01)
*H04B 7/06* (2006.01)

(52) U.S. Cl.
CPC ............. *H04B 1/18* (2013.01); *H04B 7/0608* (2013.01); *H04B 17/00* (2013.01); *H03F 2200/451* (2013.01); *H04B 2001/0408* (2013.01)

(58) Field of Classification Search
CPC .... H04B 2001/0408; H01Q 1/50; H03F 3/20; H03F 2200/451
See application file for complete search history.

(56) References Cited

U.S. PATENT DOCUMENTS

| | | | |
|---|---|---|---|
| 5,568,610 A | 10/1996 | Brown | |
| 6,594,508 B1 | 7/2003 | Ketonen | |
| 6,741,640 B1 | 5/2004 | Johnson | |
| 6,931,234 B1 | 8/2005 | Higashi | |
| 7,773,956 B2 | 8/2010 | Fukamachi et al. | |
| 8,174,364 B2 | 5/2012 | Pedigo | |
| 8,515,496 B2 | 8/2013 | Cheng et al. | |
| 9,368,008 B2 | 6/2016 | Jefferies et al. | |
| 9,680,219 B2 | 6/2017 | Filipovic et al. | |
| 9,762,039 B2 | 9/2017 | Barker et al. | |
| 10,129,003 B2 | 11/2018 | Abdelmonem et al. | |
| 2009/0160784 A1 | 6/2009 | Ishida | |
| 2013/0187807 A1* | 7/2013 | Peng | H01Q 3/24 342/175 |
| 2013/0210477 A1 | 8/2013 | Peter | |
| 2017/0195024 A1* | 7/2017 | Vo | H04B 7/18517 |
| 2018/0115197 A1 | 4/2018 | Li et al. | |
| 2018/0269920 A1* | 9/2018 | Le Naour | H04B 1/48 |
| 2018/0317160 A1 | 11/2018 | Jacops et al. | |

FOREIGN PATENT DOCUMENTS

| | | |
|---|---|---|
| CN | 102882547 A | 1/2013 |
| CN | 104244291 A | 12/2014 |
| CN | 106788575 A | 5/2017 |
| CN | 107592378 A | 1/2018 |
| JP | 2005-311536 A | 11/2005 |
| WO | 2018/067612 A2 | 4/2018 |
| WO | 2018/191129 A1 | 10/2018 |

* cited by examiner

ANTENNA DETECTION THROUGH NOISE MEASUREMENT

CROSS-REFERENCE TO RELATED APPLICATION

This application claims priority under 35 U.S.C. § 119, based on U.S. Provisional Application No. 62/825,885, filed Mar. 29, 2019; U.S. Provisional Application No. 62/828,105, filed Apr. 2, 2019; and U.S. Provisional Application No. 62/835,669, filed Apr. 18, 2019; the disclosures of which are hereby incorporated by reference herein.

BACKGROUND

Numerous wireless devices include an external antenna terminal for connecting an external antenna to the devices' transceiver. Presently, such devices detect the presence of the external antenna connected to the devices' external radio frequency (RF) connector through a mechanical switch integrated into the connector. The integrated mechanical switch creates a direct current (DC) short to ground on the external RF connector's signal lead when no external connection is made to the connector. When an external connection is made (e.g., the external antenna is connected to the external RF connector), the integrated mechanical switch opens the DC path to ground on the RF connector's signal lead. The presence of a short to ground, or an open path to ground, on the RF connector's signal lead may be detected by circuitry such that the presence of absence of a physical connection to the external RF connector may be identified. The RF connector's integrated mechanical switch, therefore, acts as a proxy to indicate to the wireless device that an external antenna is, or is not, connected to the external RF connector.

DETAILED DESCRIPTION OF THE PREFERRED EMBODIMENTS

The following detailed description refers to the accompanying drawings. The same reference numbers in different drawings may identify the same or similar elements. The following detailed description does not limit the invention.

When detecting the presence of absence of an external antenna, the mechanical switch that is integrated into external RF connectors has a number of deficiencies. The integrated switch is susceptible to mechanical failure, reducing its reliability. Additionally, use of the integrated mechanical switch for detecting the presence or absence of an external antenna enables the determination of only two states of the external antenna relative to the RF connector—either unconnected (a short to ground), or connected (a DC open to ground).

Exemplary embodiments, described herein, enable detection of the presence or absence of an external antenna at a wireless device using a solid-state solution that eliminates the use of a mechanical switch. Implementations described herein use multiple noise level measurements, including a first noise measurement across, for example, a terminating load connected to the receiver input, and a second noise measurement at the antenna RF connector terminal when connected to the receiver input. The two different noise level measurements may be used to identify the presence or absence of an external antenna connected to the RF connector terminal.

Figure 1:
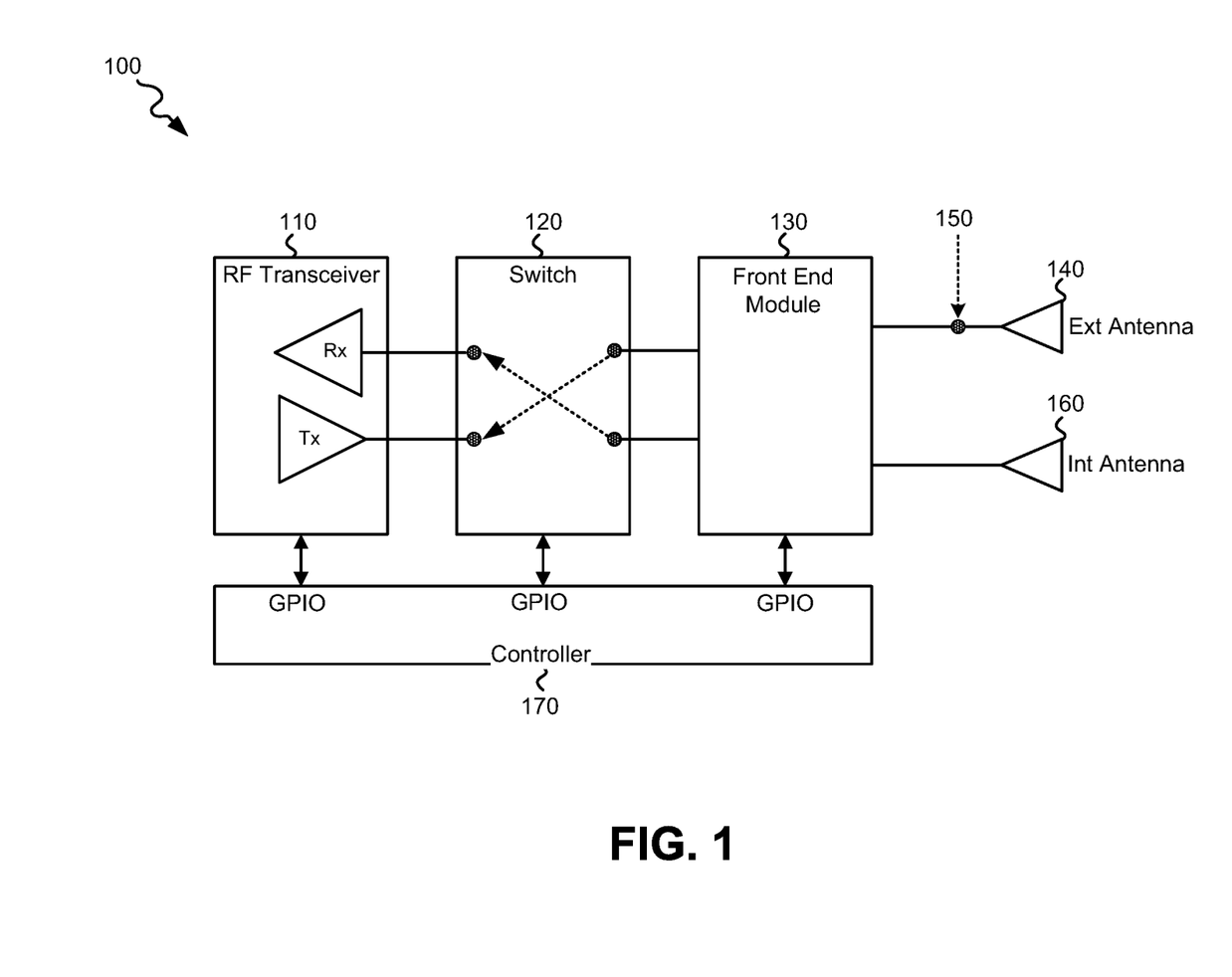
FIG. 1 is a block diagram of a wireless device according to an exemplary implementation.

FIG. 1 is a block diagram of a wireless device 100 according to an exemplary implementation. Wireless device 100 may include a RF transceiver 110, a switch 120, a front-end module (FEM) 130, an external antenna 140, an external antenna RF connector terminal 150, an internal antenna 160, and a controller 170.

RF transceiver 110 includes at least one receiver (Rx) and at least one transmitter (Tx) for receiving RF signals, and for transmitting RF signals, via either external antenna 140 or internal antenna 160. RF transceiver 110 may additionally include, as described in further detail below, noise level measurement circuitry for measuring a level of noise associated with a signal(s) received at the input of the receiver Rx of RF transceiver 110.

Switch 120 may, in one implementation, include solid-state circuitry for implementing a switching mechanism that selectively switches either: 1) the receiver Rx input to external antenna 140 and the transmitter Tx output to the internal antenna 160, or 2) the receiver Rx input to the internal antenna 160 and the transmitter Tx output to the external antenna 140. In another implementation, switch 120 may selectively switch: 1) the receiver Rx input to a terminating load (not shown); or 2) the receiver Rx input to the internal antenna 160. Switch 120 may, in one implementation, be implemented as a "cross-over" switch that operates as a dual-pole, dual-throw (DPDT) switch. In another implementation, switch 120 may be implemented as a 3-pole double throw switch.

FEM 130 may include a module that includes various functional components associated with RF reception and transmission. The functional components may include, but are not limited to, a power amplifier(s), a mixer(s), a filter(s), a switch(es), and a matching circuit(s).

External antenna 140 connects to FEM 130 via external antenna RF connector terminal 150. External antenna 140 may, therefore, be a removable antenna that can be connected to, or disconnected from, wireless device 100 via external antenna RF connector terminal 150. External antenna 140 may include any type of antenna for receiving and transmitting RF signals. The particular type of antenna, and the performance parameters associated with the antenna, may be selected based on the particular type of wireless device 100. For example, if wireless device 100 is a Bluetooth™ capable device, then external antenna 140 may include an antenna whose performance parameters enable the antenna to receive and transmit Bluetooth™ RF signals. As another example, if wireless device 100 is a Wi-Fi capable device (i.e., a device performing RF communication according to the IEEE 802.11 standards), then external antenna 140 may include an antenna whose performance parameters enable the antenna to receive and transmit Wi-Fi signals. Wireless device 100, though, may include other types of RF devices that operate with different performance parameters.

Internal antenna 160 connects to FEM 130 and may be located internally (i.e., within the housing holding the components of the wireless device 100). Internal antenna 160 may include any type of antenna for receiving and transmitting RF signals. The particular type of antenna, and the performance parameters associated with the antenna, may be selected based on the particular type of wireless device 100. In some implementations, the internal antenna 160 may be a same type of antenna, with the same performance parameters, as external antenna 140. In other implementations, the internal antenna 160 may be a different type of antenna, with different performance parameters, than external antenna 140. In some implementations, internal antenna 160 may be another external antenna, connected to wireless device 100, that is not detachable. In further implementations, internal antenna 160 may instead include another detachable external antenna that connects to another external antenna RF connector terminal (not shown in FIG. 1).

Controller 170 may include one or more processors, microprocessors, or microcontrollers that interpret and execute instructions, and/or may include logic circuitry (e.g., a field-programmable gate array (FPGA), an application specific integrated circuit (ASIC), etc.) that executes one or more processes/functions. Controller 170 may include multiple General-Purpose Input/Output (GPIO) ports for receiving and sending data, including sending control instructions and receiving control acknowledgements, from the components of wireless device 100, such as RF transceiver 110, switch 120, and/or FEM 130.

Wireless device 100 may include any type of device that communicates using wireless mechanisms (e.g., via radio frequencies). For example, wireless device 100 may be part of, or couple/connect to, a meter or meter interface unit (MIU), such as a water usage meter or a power usage meter. If part of a water usage meter, wireless device 100 may transmit water consumption data, and water meter/MIU status information, to a water utility and may additionally transmit data indicating the presence/absence of an antenna of the meter/MIU and/or data associated with an assessment of the antenna of the water meter/MIU. If part of a power usage meter, wireless device 100 may transmit power consumption data, and power meter/MIU status information, to a power utility and may additionally transmit data indicating the presence/absence of an antenna of the meter/MIU and/or data associated with an assessment of the antenna of the power meter/MIU.

Figure 2:
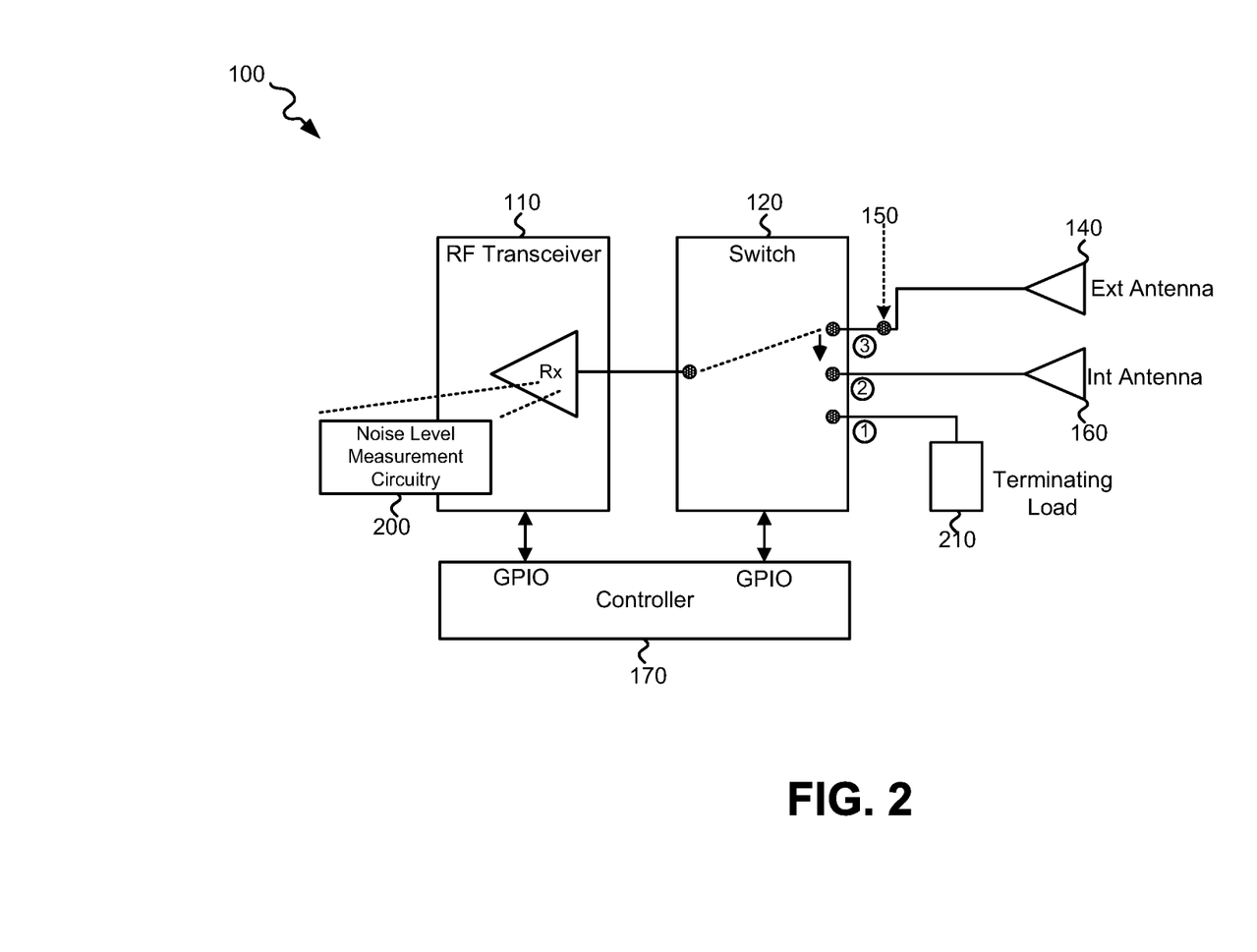
FIG. 2 illustrates a first example of the wireless device of FIG. 1 in which a terminating load is switched into, and out of, a noise measuring process to detect the presence or absence of an external antenna at an external antenna radio frequency connector terminal of the wireless device.

FIG. 2 illustrates a first example of the wireless device 100 of FIG. 1 in which a terminating load is switched into, and out of, a noise measuring process used to detect the presence or absence of an external antenna 140 at external antenna RF connector terminal 150. In the example shown, the input of the receiver Rx is connected to one terminal of switch 120, and switch 120 selectively switches the receiver Rx input to either the external antenna 140 (identified with a "3"), the internal antenna 160 (identified with a "2"), or a terminating load 210 (identified "1"). The RF transceiver 110 includes noise level measurement circuity 200 that measures a noise level associated with signals received at the input to the receiver Rx. In one implementation, the noise level measurement circuitry 200 includes Receive Signal Strength Indication (RSSI) circuitry of the receiver Rx. The RSSI circuitry measures and calculates a value that represents a level of sampled noise in the input signal. The terminating load 210 may include a known load impedance that, when connected to the receiver Rx input, reduces the impact or influence of external RF signal sources and RF noise on an internal reference noise measurement (described further below with respect to FIG. 3A). In another implementation, the terminating load 210 may include a resistive matching load.

Figure 3A:
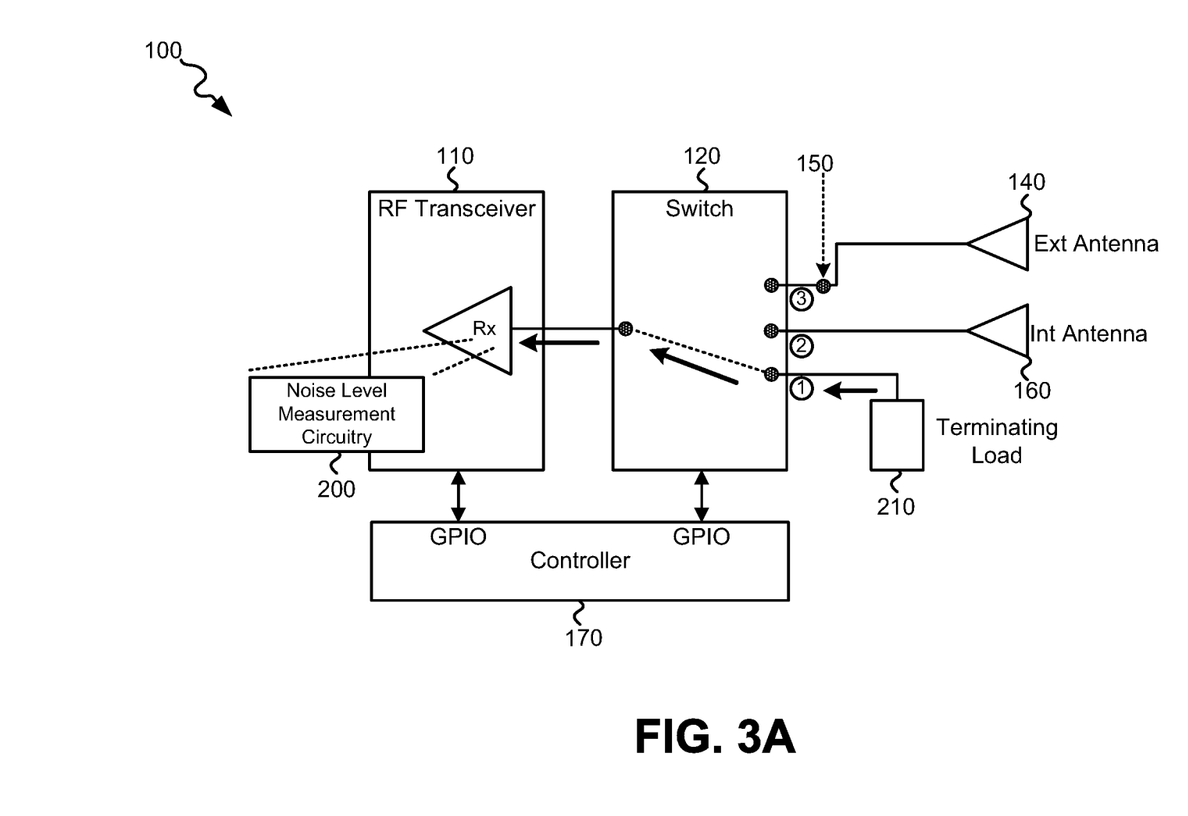
FIG. 3A illustrates a first mode of operation of the exemplary implementation of FIG. 2 in which the terminating load is connected across the input of the receiver Rx of the radio frequency transceiver and a first noise level is measured by noise level measurement circuitry.

FIG. 3A illustrates a first mode of operation of the exemplary implementation of FIG. 2 in which the terminating load 210 is connected across the input of the receiver Rx of RF transceiver 110 and a first noise level is measured by noise level measurement circuitry 200. The controller 170 first sends a control instruction(s) to cause switch 120 to connect the terminating load 210 (identified with a "1") to the input of the receiver Rx of the RF transceiver 110. Once the terminating load 210 is connected across the input of the receiver Rx, controller 170 sends a control instruction(s) to noise level measurement circuitry 200 to cause the circuitry 200 to measure a noise level across the terminating load 210. Circuitry 200, based on the control instruction(s) received from controller 170, measures a noise level across terminating load 210, and calculates a RSSI noise level value (Noise$_{Ref}$) as an internal reference noise level. Circuitry 200 sends the calculated RSSI noise level Noise$_{Ref}$ to the controller 170 via a GPIO port. Controller 170 may store the received RSSI noise level in memory.

Figure 3B:
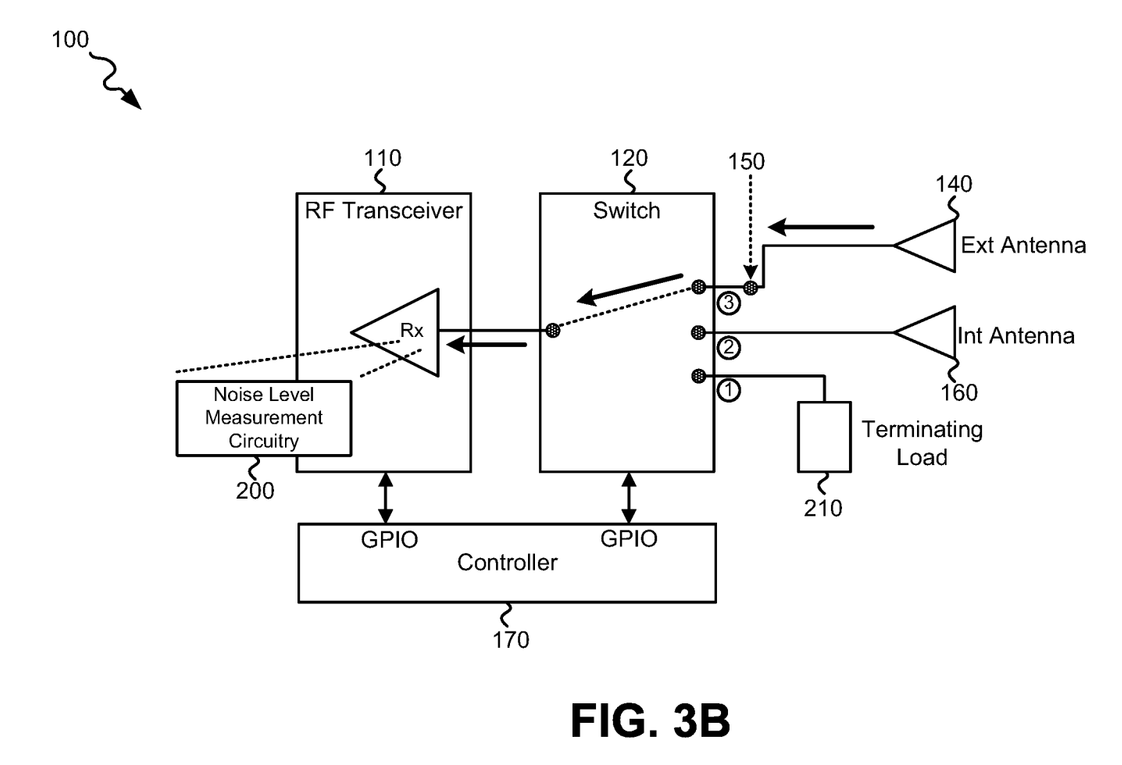
FIG. 3B illustrates a second mode of operation of the exemplary implementation of FIG. 2 in which the receiver input is connected, via a switch, to the external antenna radio frequency connector terminal and a second noise level is measured by the noise level measurement circuitry.

FIG. 3B illustrates a second mode of operation of the exemplary implementation of FIG. 2 in which the receiver Rx input is connected, via switch 120, to the external antenna RF connector terminal 150 and a second noise level is measured by the noise level measurement circuitry. Subsequent to the first mode of operation, described above with respect to FIG. 3A, controller 170 instructs switch 120 to switch the receiver Rx input from a connection to the terminating load 210 (as shown in FIG. 3A) to a connection to the external antenna RF connector terminal 150 (shown with a "3" in FIG. 3B). Once the receiver Rx input is connected to the external antenna RF connector terminal 150, controller 170 sends a control instruction(s) to noise level measurement circuitry 200 to cause the circuitry 200 to measure a noise level at the external antenna RF connector terminal 150. Circuitry 200, based on the control instruction(s) received from controller 170, measures a noise level received at the external RF connector terminal 150, and calculates a RSSI noise level value ($Noise_{Ext}$) as an external noise level. Circuitry 200 sends the calculated RSSI noise level $Noise_{Ext}$ to the controller 170. Controller 170 may store the received RSSI noise level in memory.

If an external antenna 140 is connected to external antenna RF connector terminal 150, the external antenna 140, via its inherent voltage and power gain characteristics, may generate a signal at external antenna RF connector terminal 150 that includes RF noise received from various environmental sources (e.g., thermal noise, man-made RF noise, solar noise, lunar noise, galactic noise, etc.). The additive RF noise contained in the signal from external antenna 140 increases the total noise level injected into the input of the receive Rx relative to the internal reference noise level $Noise_{Ref}$ measured across the terminating load 210.

Controller 170 may then analyze the measured reference noise level $Noise_{Ref}$ and the external noise level $Noise_{Ext}$ to determine whether external antenna 140 is currently electrically connected to the external antenna RF connector terminal 150. In one implementation, controller 170 may analyze the external noise level $Noise_{Ext}$ and the reference noise level $Noise_{Ref}$ to determine a relative difference between the two noise levels. For example, if $Noise_{Ext}$ is greater than $Noise_{Ref}$, then controller 170 may determine that an external antenna is connected to the external antenna RF connector terminal 150. Controller 170 may determine, in one implementation, that the external antenna is connected to connector terminal 150 if the external noise level $Noise_{Ext}$ is greater than a sum of the reference noise level $Noise_{Ref}$ and a threshold (Th) value (e.g., $Noise_{Ext} > Noise_{Ref} + Th$).

Figure 3C:
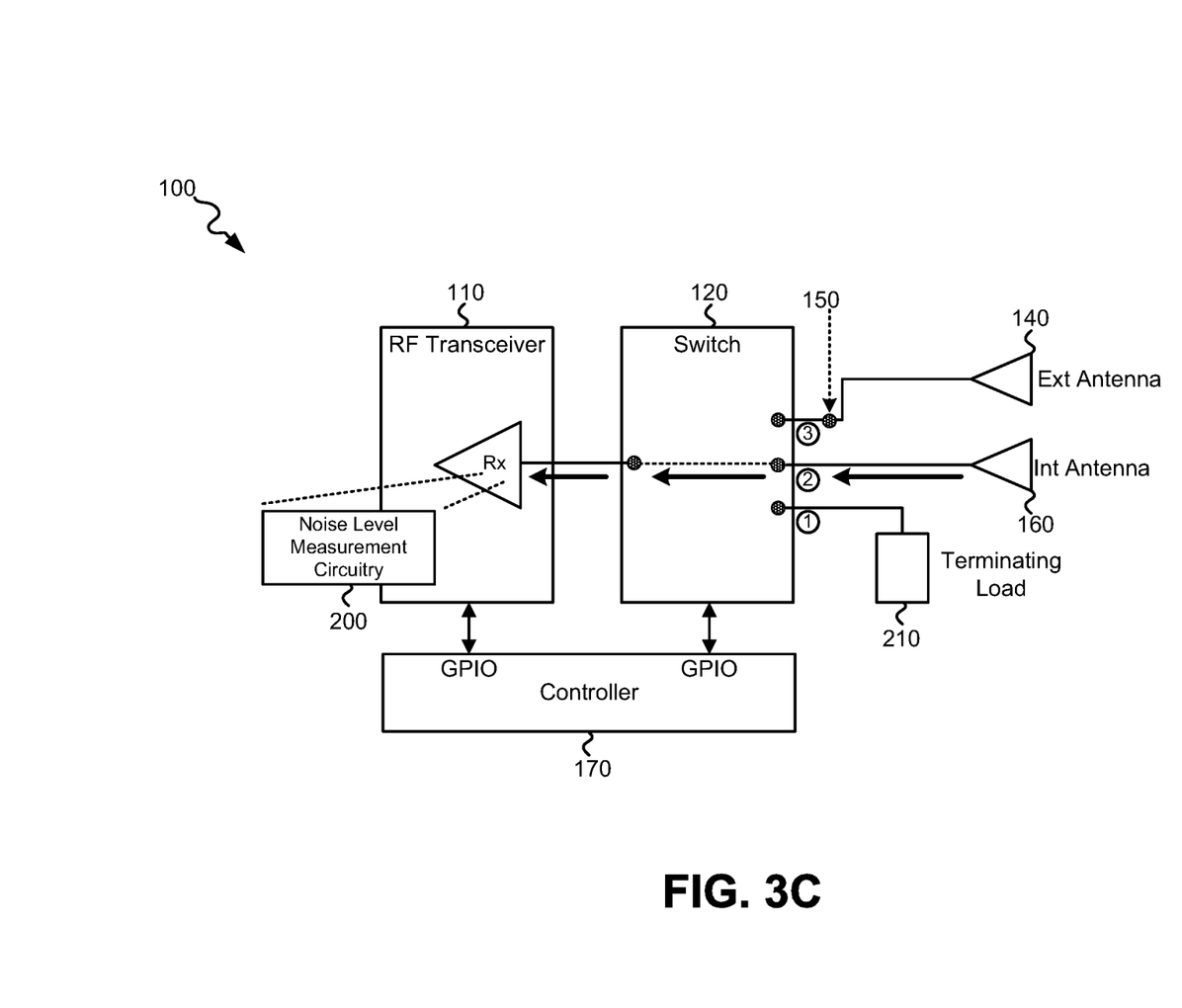
FIG. 3C illustrates an alternative implementation of the first mode of operation described above with respect to FIG. 3A in which an internal antenna, instead of the terminating load, is connected to the input of the receiver Rx and the first noise level is measured.

FIG. 3C illustrates an alternative implementation of the first mode of operation described above with respect to FIG. 3A. In this implementation, an internal antenna 160, instead of the terminating load 210, is connected to the input of the receiver Rx of RF transceiver 110 and the first noise level is measured by noise level measurement circuitry 200. The controller 170 first sends a control instruction(s) to cause switch 120 to connect the internal antenna 160 (identified with a "2") to the input of the receiver Rx of the RF transceiver 110. Once the internal antenna 160 is connected across the input of the receiver Rx, controller 170 sends a control instruction(s) to noise level measurement circuitry 200 to cause the circuitry 200 to measure a noise level received from the internal antenna 160. Circuitry 200, based on the control instruction(s) received from controller 170, measures a noise level received from internal antenna 160, and calculates a RSSI noise level value ($Noise_{Ref}$) as a reference noise level. Circuitry 200 sends the calculated RSSI noise level $Noise_{Ref}$ to the controller 170 via a GPIO port. Controller 170 may store the received RSSI noise level in memory.

Figure 4:
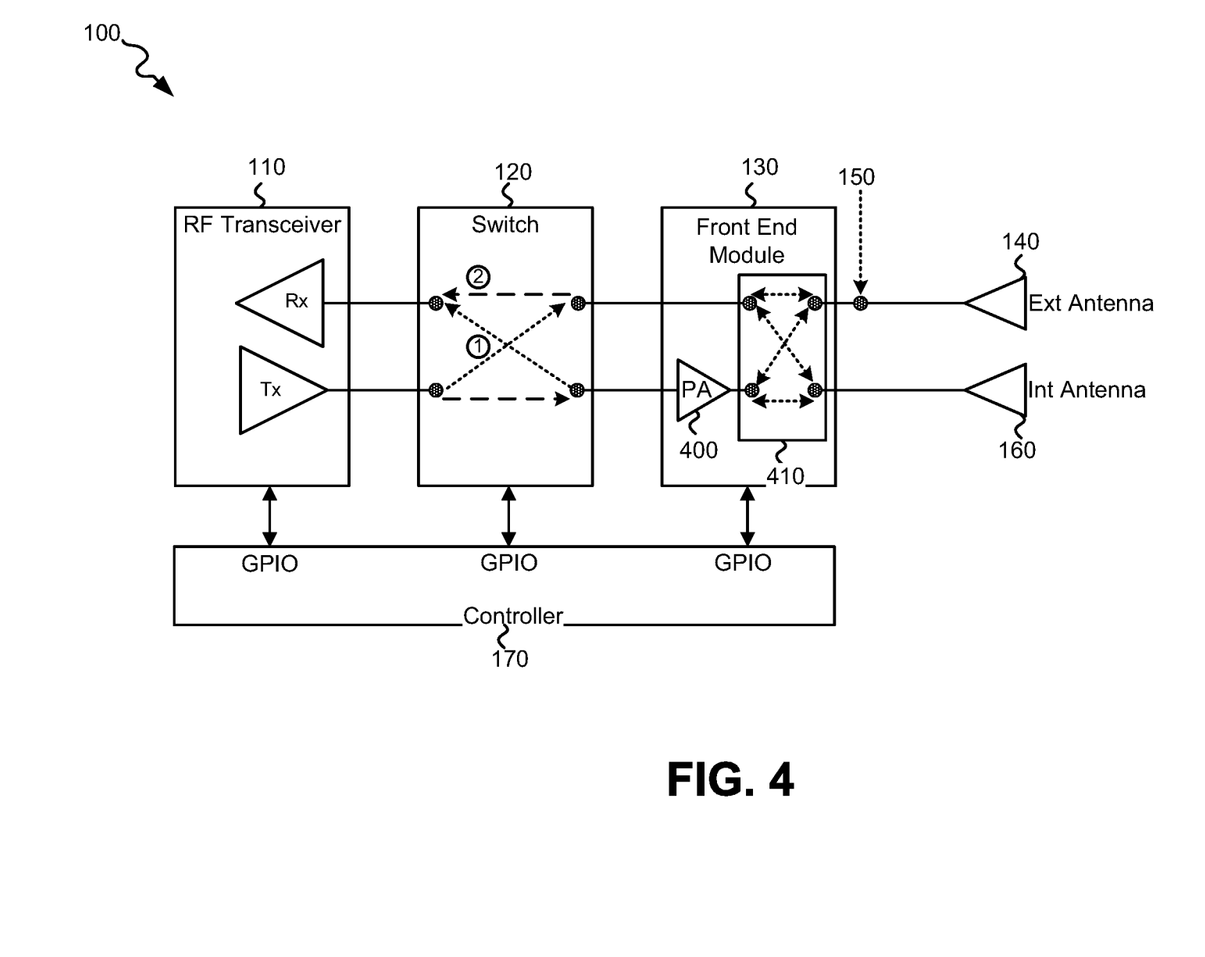
FIG. 4 illustrates a second example of the wireless device of FIG. 1 in which existing circuitry within the front-end module of the wireless device serves as the terminating load for performing the first noise level measurement.

In a further implementation, measurement(s) of a noise level received from internal antenna 160 (e.g., as shown in FIG. 3C), and measurement(s) of a noise level across a terminating load (either terminating load 210 of FIG. 3A or PA 400 (or other existing circuitry) of front end module 130 of FIG. 4), may both used as reference noise levels. Controller 170 may use both measured reference noise levels in determining whether external antenna 140 is connected to external connector 150 (e.g., in block 640 of FIG. 6 below). For example, a first weight ($w_1$) may be applied to the measured noise level received from internal antenna 160 and a second weight ($s_2$) may be applied to the measured noise level across the terminating load and the two weighted noise levels may both be used to determine the reference noise level $Noise_{Ref}$ that may be compared with the external noise level $Noise_{Ext}$ measured at the external antenna connector terminal 150. In some implementations, the weight levels $w_1$ and $w_2$ may be calculated or empirically derived. The two weighted noise levels may be combined by, for example, applying a formula to the two weighted noise levels to generate the reference noise level $Noise_{Ref}$. In one example, the noise reference level may equal the weighted sum of noise level measured at internal antenna 160 and the noise level measured at the terminating load: $Noise_{Ref} = w_1 * Noise_{IntAnt} + w_2 * Noise_{termload}$.

FIG. 4 illustrates a second example of the wireless device 100 of FIG. 1 in which existing circuitry within FEM 130 serves as the terminating load for performing the first noise level measurement (e.g., the reference noise level measurement $Noise_{Ref}$), and the circuitry within FEM 130 is switched into, and out of, the noise measuring to detect the presence of absence of an external antenna 140 at external antenna RF connector terminal 150. In the example shown, the input of the receiver Rx is connected to a first terminal of switch 120, and the output of the transmitter Tx is connected to a second terminal of switch 120. In one implementation, switch 120 may include a dual-pole, dual-throw (DPDT) RF "cross-over" switch that simultaneously, based on instructions from controller 170, switches the input of the receiver and the output of the transmitter to opposing terminals of the switch 120. For example, as shown in FIG. 4 (designated with a "1" and short dashed lines), switch 120, in a first switch position, connects the input of the receiver Rx to the input of a power amplifier 400 of FEM 130, and connects the output of the transmitter Tx to a terminal of a switching mechanism 410 of FEM 130. As further shown in FIG. 4 (designated with a "2" and longer dashed lines), switch 120, in a second switch position, connects the input of the receiver Rx to the terminal of the switching mechanism 410 of FEM 130, and connects the output of the transmitter Tx to the input of the power amplifier (PA) 400 of FEM 130. Additionally, switching mechanism 410 may selectively switch, based on instructions received from controller 170, either external antenna RF connector terminal 150 or internal antenna 160 through to the receiver Rx or the transmitter Tx. Controller 170 may issue instructions or commands or receive data, via GPIO ports, to RF transceiver 110, switch 120, and/or FEM 130.

Figure 5A:
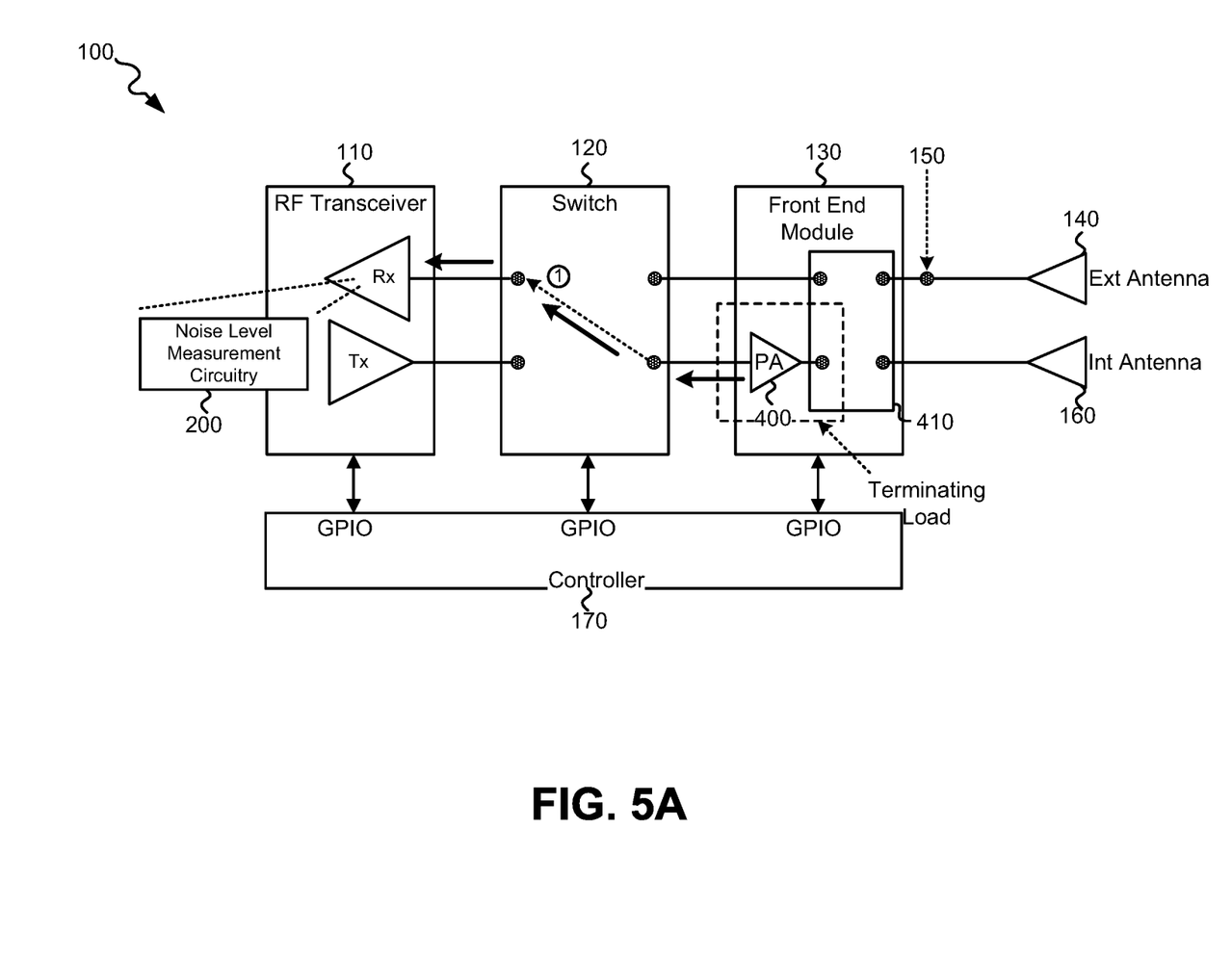
FIG. 5A illustrates a first mode of operation of the exemplary implementation of FIG. 4 in which existing circuitry of the front-end module of the wireless device is connected to the input of the receiver Rx of the radio frequency transceiver and a first noise level is measured.

FIG. 5A illustrates a first mode of operation of the exemplary implementation of FIG. 4 in which existing circuitry (e.g., power amplifier 400) of FEM 130 is connected to the input of the receiver Rx of RF transceiver 110 and a first noise level is measured by noise level measurement circuitry 200. In the first mode, controller 170 sends a control instruction(s) to cause switch 120 to connect power amplifier 400 of FEM 130 to the input of the receiver Rx of the RF transceiver 110. Once the power amplifier 400 is connected to the input of the receiver Rx, controller 170 sends a control instruction(s) to noise level measurement circuitry 200 to cause the circuitry 200 to measure a noise level at the receiver input received from the power amplifier 400. Circuitry 200, based on the control instruction(s) received from controller 170, measures a noise level across power amplifier 400, which acts as a terminating load, and calculates a RSSI noise level value ($Noise_{Ref}$) as an internal reference noise level. Circuitry 200 sends the calculated RSSI noise level $Noise_{Ref}$ to the controller 170. Controller 170 may store the received RSSI noise level in memory.

Figure 5B:
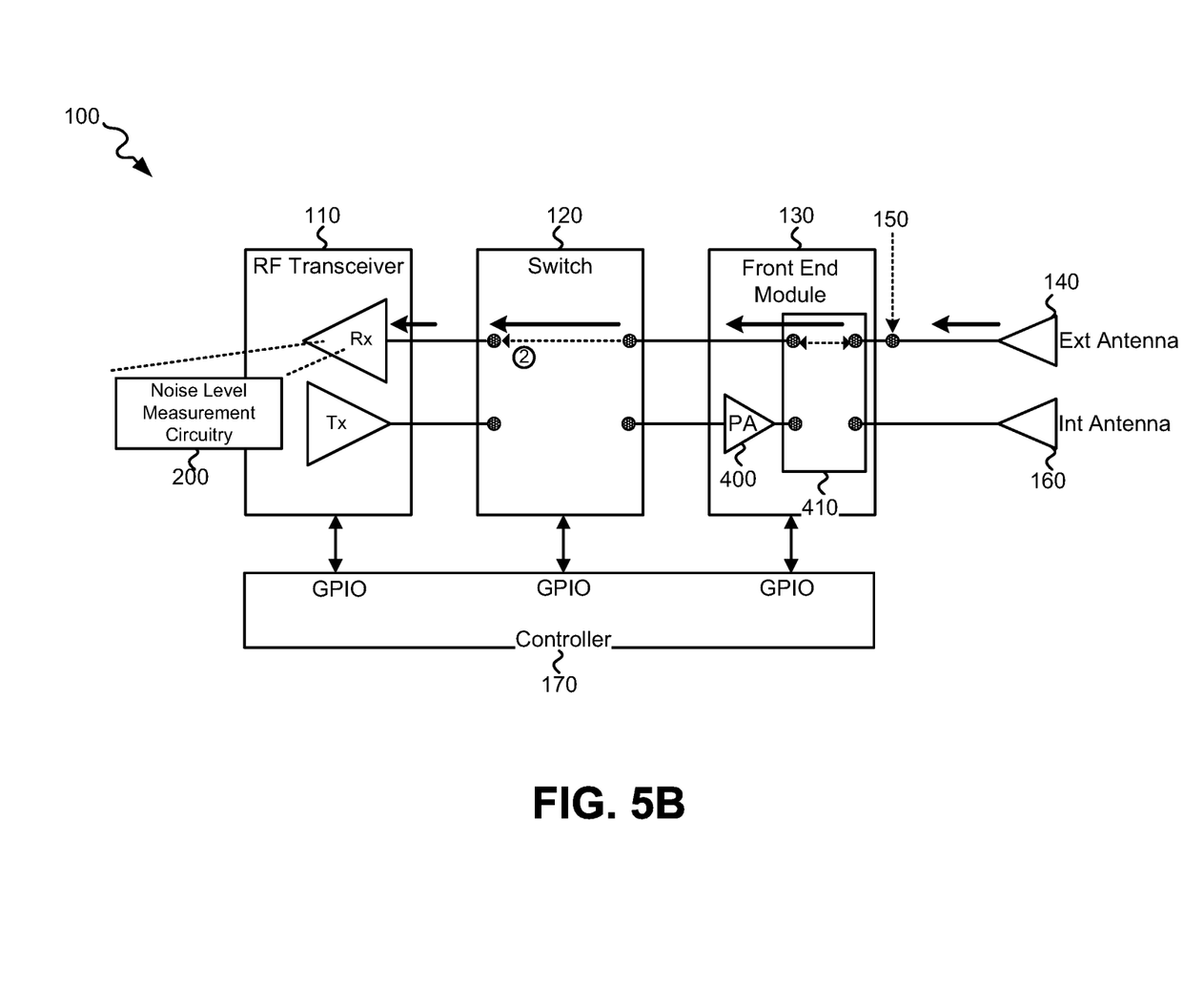
FIG. 5B illustrates a second mode of operation of the exemplary implementation of FIG. 4 in which the receive input is connected, via a switch and a switching mechanism, to the external antenna radio frequency connector terminal.

FIG. 5B illustrates a second mode of operation of the exemplary implementation of FIG. 4 in which the receiver input of RF transceiver 110 is connected, via switch 120 and switching mechanism 410, to the external antenna RF connector terminal 150. Subsequent to the first mode of operation, described above with respect to FIG. 5A, controller 170 instructs switch 120 to switch the connection between the receiver Rx input and the existing circuitry (e.g., power amplifier 400) of FEM 130, to the external antenna RF connector terminal 150. Once the receiver Rx input is connected to the external antenna RF connector terminal 150, controller 170 sends a control instruction(s) to noise level measurement circuitry 200 to cause the circuitry 200 to measure a noise level at the external antenna RF connector terminal 150. Circuitry 200, based on the control instruction(s) received from controller 170, measures a noise level received at the external RF connector terminal 150, and calculates a RSSI noise level value ($Noise_{Ext}$) as an external noise level. Circuitry 200 sends the calculated RSSI noise level $Noise_{Ext}$ to the controller 170, and controller 170 may store the received RSSI noise level in memory.

If an external antenna 140 is connected to external antenna RF connector terminal 150, the external antenna 140, via its inherent voltage and power gain characteristics, may generate a signal at connector terminal 150 that includes RF noise received from various environmental sources (e.g., thermal noise, man-made RF noise, solar noise, lunar noise, galactic noise, etc.). The additive RF noise contained in the signal from external antenna 140 increases the total noise level injected into the input of the receiver Rx relative to the internal reference noise level $Noise_{Ref}$ measured from the existing circuitry of FEM 130 (e.g., PA 400) acting as a terminating load.

Controller 170 analyzes the reference noise level $Noise_{Ref}$ and the external noise level $Noise_{Ext}$ to determine whether external antenna 140 is currently connected to the external antenna RF connector terminal 150. In one implementation, controller 170 may analyze the external noise level $Noise_{Ext}$ and the reference noise level $Noise_{Ref}$ to determine a relative difference between the two noise levels. For example, if $Noise_{Ext}$ is greater than $Noise_{Ref}$, then controller 170 may determine that an external antenna is connected to the external antenna RF connector terminal 150. Controller 170 may determine, in one implementation, that the external antenna is connected to connector terminal 150 if the external noise level $Noise_{Ext}$ is greater than a sum of the reference noise level $Noise_{Ref}$ and a threshold (Th) value (e.g., $Noise_{Ext} > Noise_{Ref} + Th$).

Figure 6:
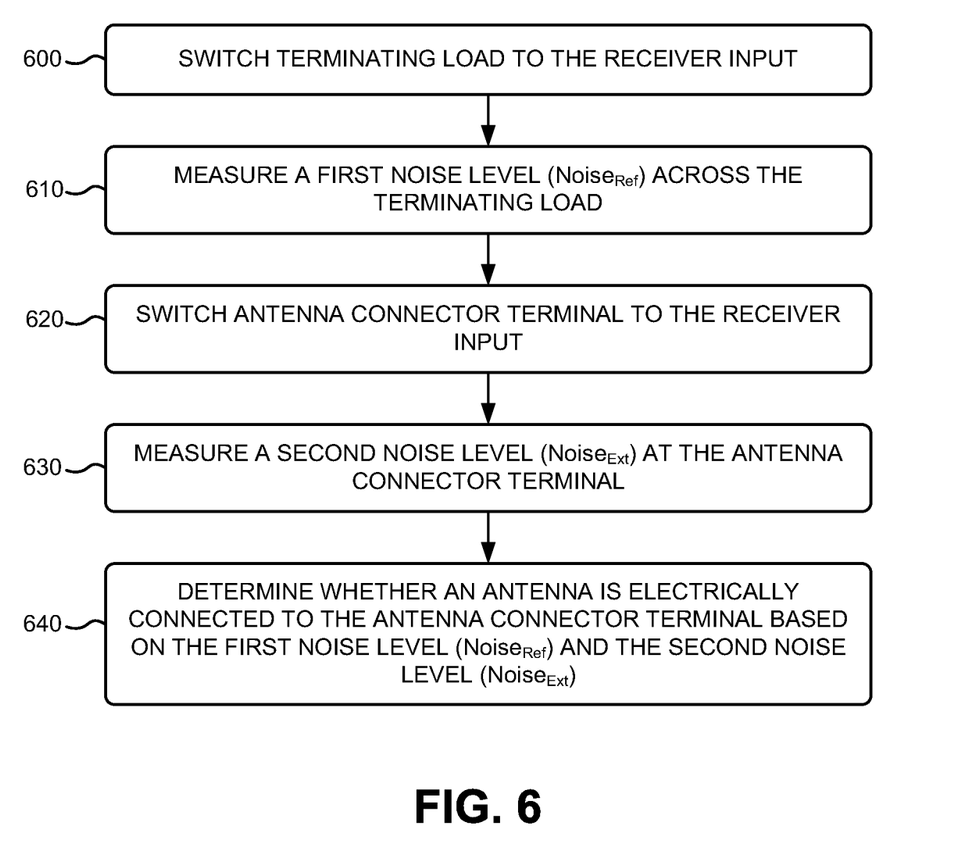
FIG. 6 illustrates an exemplary process for detecting whether an antenna is connected to the antenna connector terminal of a wireless device based on noise measurements.

FIG. 6 illustrates an exemplary process for detecting whether an antenna 140 is connected to the antenna connector terminal 150 of a wireless device based on noise measurements. The exemplary process of FIG. 6 may, in some implementations, be implemented by the components of wireless device 100. In other implementations, the exemplary process of FIG. 6 may be implemented by the components of wireless device 100 in conjunction with at least one external device or module.

The process includes switching a terminating load to connect the input of the receiver Rx of the wireless device 100 (block 600). In the implementation shown in FIG. 3A, controller 170 issues an instruction to switch 120 to connect the input of the receiver Rx of RF transceiver 110 to the terminating load 210 (designated with a "1"). In the implementation shown in FIG. 5A, controller 170 issues an instruction to switch 120 to connect the input of the receiver Rx of RF transceiver 110 to the input of PA 400 of FEM 130. In this implementation, PA 400 of FEM 130 acts as the terminating load for the reference noise measurement. In the implementation shown in FIG. 3C, the terminating load may include internal antenna 160, and controller 170 issues an instruction to switch 120 to connect the input of the receiver Rx of RF transceiver 110 to internal antenna 160.

A first noise level $Noise_{Ref}$ is measured across the terminating load (block 610). In some implementations, noise level measurement circuitry 400 of receiver Rx of RF transceiver 110 measures a reference noise level across the terminating load based on an instruction(s) received from controller 170. In other implementations, a device or module that is external to wireless device 100 may measure the noise level across the terminating load. The noise level measurement circuitry 200 may include RSSI circuitry that measures and calculates a value representative of a level of sampled noise in a signal at the input of the receiver Rx. In the implementation shown in FIG. 3A, the first noise level $Noise_{Ref}$ is measured across terminating load 210. In the implementation shown in FIG. 5A, the first noise level $Noise_{Ref}$ is measured at the input of PA 400 of FEM 130. In the alternative implementation shown in FIG. 3C, the first noise level $Noise_{Ref}$ is measured at the internal antenna 160 (shown with a "2" in FIG. 3C).

The antenna connector terminal 150 is switched to connect to the input of the receiver Rx of the wireless device 100 (block 620). In the implementation shown in FIG. 3A, controller 170 issues an instruction to switch 120 to connect the input of the receiver Rx of RF transceiver 110 to the external antenna RF connector terminal 150. In the implementation shown in FIG. 5A, controller 170 issues instructions to switch 120 and switching mechanism 410 to connect the input of the receiver Rx of RF transceiver 110 to the external antenna RF connector terminal 150.

A second noise level $Noise_{Ext}$ is measured at the antenna connector terminal (block 630). In some implementations, noise level measurement circuitry 400 of receiver Rx of RF transceiver 110 measures an external noise level at the external antenna RF connector terminal 150 based on an instruction(s) received from controller 170. In other implementations, a device or module that is external to wireless device 100 may measure the noise level at the external antenna RF connector terminal 150. In the implementation shown in FIG. 3B, the second noise level $Noise_{Ext}$ is measured at external antenna RF connector terminal 150 via the switched connection of switch 120. In the implementation shown in FIG. 5B, the second noise level $Noise_{Ext}$ is measured at external antenna RF connector terminal 150 via the switched connection of switch 120 and a switched connection of switching mechanism 410 of FEM 130. In implementations in which noise level measurement circuitry 200 includes RSSI circuitry, circuitry 200 measures and calculates a value representative of a level of sampled noise in a signal, received from external antenna RF connector terminal 150 at the input of the receiver Rx.

Controller 170 determines whether an antenna 140 is electrically connected to the antenna RF connector terminal 150 based on the first noise level $Noise_{Ref}$ and the second noise level $Noise_{Ext}$ (block 640). In one implementation, controller 170 may analyze the external noise level $Noise_{Ext}$ of block 630 and the reference noise level $Noise_{Ref}$ of block 610 to determine a relative difference between the two noise levels. For example, controller 170 may determine that an antenna 140 is connected to external antenna RF connector terminal 150 if the external noise level $Noise_{Ext}$ is greater than a sum of the reference noise level $Noise_{Ref}$ and a threshold (Th) value (e.g., $Noise_{Ext} > Noise_{Ref} + Th$). In some implementations, controller 170 may select the use (i.e., for transmission or reception) of either external antenna 140 or internal antenna 160 based on the analysis of the external noise level Noise$_{Ext}$ of block 630 and the reference noise level Noise$_{Ref}$ of block 610. Thus, controller 170, in some implementations, may select either external antenna 140 or internal antenna 160 for transmission and/or reception based on the determination of whether external antenna 140 is connected to connector terminal 150.

Implementations described herein provide improvements over the use of an integrated mechanical switch for detecting the connection of an external antenna to an antenna connector. The noise level measurement technique described herein eliminates use of a mechanical switching antenna connector, thus ensuring higher reliability. The noise level measurement technique further can be implemented easily, only requiring changes to firmware or code, and not requiring any additional hardware components or circuitry. The noise level measurement technique described herein additionally reduces costs associated with a wireless device by eliminating the relatively expensive mechanical switching antenna connector used for antenna detection by existing wireless devices.

The antenna detection techniques described herein may be performed in conjunction with other antenna detection techniques, such as the antenna detection techniques, using an oscillator circuit, described in U.S. application Ser. No. 16/832,421 (corresponding to U.S. Provisional Application No. 62/835,885), or the antenna detection techniques, using forward and reflected power measurements, described in U.S. application Ser. No. 16/832,483 (corresponding to U.S. Provisional Application No. 62/835,669). U.S. application Ser. No. 16/832,421 and U.S. application Ser. No. 16/832,483 are incorporated by reference herein in their entireties. The antenna detection techniques described herein, and the antenna detection techniques described in U.S. application Ser. No. 16/832,421 and U.S. application Ser. No. 16/832,483 may be selectively used relative to one another, may be performed in series, or may be performed in parallel, to detect the presence or absence of an antenna connected or coupled to a port or antenna connector terminal of a wireless device 100, such as a Meter Interface Unit (MIU). For example, a wireless device 100 may execute the exemplary process of FIGS. 7A and 7B, or FIG. 9, of U.S. application Ser. No. 16/832,483 in parallel with the exemplary process of FIG. 6 of the present application (that corresponds to U.S. Provisional Application No. 62/828,105) and/or the exemplary process of FIG. 5 of U.S. application Ser. No. 16/832,421. As another example, the wireless device 100 may selectively execute one of: 1) the exemplary process of FIG. 6 of the present application; 2) the exemplary process of FIGS. 7A and 7B or FIG. 9 of U.S. application Ser. No. 16/832,483; or 3) the exemplary process of FIG. 5 of U.S. application Ser. No. 16/832,421 based on certain criteria.

The foregoing description of implementations provides illustration and description, but is not intended to be exhaustive or to limit the invention to the precise form disclosed. Modifications and variations are possible in light of the above teachings or may be acquired from practice of the invention.

Certain features described above may be implemented as "logic," a "unit," or a "controller" that performs one or more functions. This logic, unit, or controller may include hardware, such as one or more processors, microprocessors, microcontrollers, application specific integrated circuits, or field programmable gate arrays, software, or a combination of hardware and software.

No element, act, or instruction used in the description of the present application should be construed as critical or essential to the invention unless explicitly described as such. Also, as used herein, the article "a" is intended to include one or more items. Further, the phrase "based on" is intended to mean "based, at least in part, on" unless explicitly stated otherwise.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A system, comprising:
    a radio frequency (RF) receiver having an input;
    an antenna terminal configured to connect to an external antenna;
    one or more switches configured to switch the input of the RF receiver to a terminating load that is not an antenna, or to an internal antenna;
    noise level measurement circuitry configured to measure a first RF noise level across the terminating load or the internal antenna,
    wherein the one or more switches are further configured to switch the input of the RF receiver to the antenna terminal, and
    wherein the noise level measurement circuitry is further configured to measure a second RF noise level received at the antenna terminal; and
    a controller configured to determine whether an external antenna is connected to the antenna terminal based on the first RF noise level and the second RF noise level.

2. The system of claim 1, wherein the controller is further configured to select either the external antenna, or the internal antenna, for transmission or reception based on the first RF noise level and the second RF noise level.

3. The system of claim 1, wherein the controller, when determining whether an external antenna is connected to the antenna terminal, is further configured to:
    compare the second RF noise level with the first RF noise level to determine whether the antenna is connected to the antenna terminal.

4. The system of claim 3, wherein the controller, when comparing the second RF noise level with the first RF noise level, is further configured to:
    determine if the second RF noise level is greater than a sum of the first RF noise level and a threshold value, and
    determine that an external antenna is connected to the antenna terminal if the second RF noise level is greater than the sum of the first RF noise level and the threshold value.

5. The system of claim 1, wherein, when measuring the first RF noise level, the noise level measurement circuitry is configured to measure a receive signal strength indication (RSSI) across the terminating load as the first RF noise level.

6. The system of claim 1, wherein, if an external antenna is connected to the antenna terminal, the second RF noise level comprises RF noise from environmental sources received by the external antenna through the antenna's voltage and power gain characteristics.

7. The system of claim 1, wherein the system comprises a wireless device coupled to a meter or meter interface unit (MIU) and wherein the terminating load comprises circuitry of a front-end module of the wireless device.

8. A method, comprising:
switching an input of a radio frequency (RF) receiver to connect to a terminating load that is not an antenna or to an internal antenna;
measuring a first RF noise level across the connected terminating load or the connected internal antenna;
switching the input of the RF receiver to connect to an external antenna terminal;
measuring a second RF noise level received at the external antenna terminal; and
determining whether an external antenna is connected to the external antenna terminal based on the first RF noise level and the second RF noise level.

9. The method of claim 8, further comprising:
selecting either the external antenna, or the internal antenna, for transmission or reception based on the first RF noise level and the second RF noise level.

10. The method of claim 8, wherein determining whether an external antenna is connected to the external antenna terminal further comprises:
comparing the second RF noise level with the first RF noise level to determine whether an external antenna is connected to the external antenna terminal.

11. The method of claim 10, wherein the comparing the second RF noise level with the first RF noise level further comprises:
determining if the second RF noise level is greater than a sum of the first RF noise level and a threshold value, and
determining that an external antenna is connected to the external antenna terminal if the second RF noise level is greater than the sum of the first RF noise level and the threshold value.

12. The method of claim 8, wherein measuring the first RF noise level comprises:
measuring a receive signal strength indication (RSSI) across the terminating load or the internal antenna as the first RF noise level.

13. The method of claim 8, wherein, if the external antenna is connected to the external antenna terminal, the second RF noise level comprises RF noise from environmental sources received by the external antenna through the external antenna's voltage and power gain characteristics.

14. The method of claim 8, wherein the RF receiver, the internal antenna, and the external antenna comprise components of a wireless device, wherein the terminating load comprises circuitry of a front-end module of the wireless device, and wherein the circuitry of the front-end module comprises a power amplifier.

15. A wireless device coupled to a meter or meter interface unit (MIU), comprising:
a radio frequency (RF) receiver having an input;
an external antenna connector terminal configured to connect to an antenna;
one or more switches configured to switch the input of the RF receiver to connect to a terminating load that is not an antenna, to an internal antenna of the wireless device, or to the external antenna connector terminal; and
a controller configured to:
instruct the one or more switches to switch the input of the RF receiver to connect to the terminating load or to the internal antenna,
receive a measurement of a first RF noise level measured across the terminating load or the internal antenna,
instruct the one or more switches to switch the input of the RF receiver to connect to the external antenna connector terminal,
receive a measurement of a second RF noise level measured at the external antenna connector terminal, and
determine whether an external antenna is connected to the external antenna connector terminal based on the first RF noise level and the second RF noise level.

16. The wireless device of claim 15, wherein the controller is further configured to:
select either the external antenna, or the internal antenna, for transmission or reception based on the first RF noise level and the second RF noise level.

17. The wireless device of claim 15, wherein the controller, when determining whether an external antenna is connected to the external antenna connector terminal, is further configured to:
compare the second RF noise level with the first RF noise level to determine whether the external antenna is connected to the external antenna connector terminal.

18. The wireless device of claim 17, wherein the controller, when comparing the second RF noise level with the first RF noise level, is further configured to:
determine if the second RF noise level is greater than a sum of the first RF noise level and a threshold value, and
determine that an external antenna is connected to the external antenna connector terminal if the second RF noise level is greater than the sum of the first RF noise level and the threshold value.

19. The wireless device of claim 15, wherein the received first RF noise level comprises a receive signal strength indication (RSSI) measured across the terminating load.

20. The wireless device of claim 15, wherein, if the external antenna is connected to the external antenna connector terminal, the second RF noise level comprises RF noise from environmental sources received by the external antenna.

\* \* \* \* \*